United States Patent [19]

Takahashi et al.

[11] Patent Number: 4,920,296

[45] Date of Patent: Apr. 24, 1990

[54] ELECTRONIC COMPONENT HAVING A PLATE-SHAPED ELEMENT

[75] Inventors: Hiroyuki Takahashi; Takashi Yamamoto; Takeo Nakadachi, all of Nagaokakyo, Japan

[73] Assignee: Murata Manufacturing Co., Ltd., Japan

[21] Appl. No.: 388,764

[22] Filed: Aug. 2, 1989

Related U.S. Application Data

[63] Continuation of Ser. No. 273,109, Nov. 16, 1988, abandoned, which is a continuation of Ser. No. 787,421, Oct. 15, 1985, abandoned.

[30] Foreign Application Priority Data

Oct. 17, 1984 [JP] Japan ................. 59-219285

[51] Int. Cl.$^5$ ............................. H01L 41/08
[52] U.S. Cl. .................. 310/348; 310/320; 310/340; 310/370
[58] Field of Search ................ 310/348–355, 310/320, 321, 366, 370, 340

[56] References Cited

U.S. PATENT DOCUMENTS

| | | | |
|---|---|---|---|
| 3,622,816 | 11/1971 | McGrew | 310/348 X |
| 4,216,402 | 8/1980 | Engdahl | 310/320 |
| 4,375,041 | 2/1983 | Aizawa et al. | 310/348 |
| 4,451,754 | 5/1984 | Stolz et al. | 310/348 |
| 4,639,631 | 1/1987 | Chason et al. | 310/348 X |
| 4,652,787 | 3/1987 | Zingg | 310/348 X |
| 4,703,218 | 10/1987 | Takahashi et al. | 310/348 |
| 4,757,581 | 7/1988 | Yamada et al. | 310/348 X |

FOREIGN PATENT DOCUMENTS

| | | | |
|---|---|---|---|
| 45-7782 | 3/1970 | Japan | 310/348 |
| 0023542 | 3/1978 | Japan | 310/321 |
| 0027383 | 3/1978 | Japan | 310/348 |
| 0069595 | 6/1978 | Japan | 310/321 |
| 0139391 | 10/1979 | Japan | 310/348 |
| 0000635 | 1/1980 | Japan | 310/348 |
| 0168418 | 12/1981 | Japan | 310/348 |
| 0012415 | 1/1983 | Japan | 310/348 |
| 0012416 | 1/1983 | Japan | 310/348 |
| 58-138115 | 8/1983 | Japan | 310/313 R |
| 0148419 | 8/1984 | Japan | 310/348 |
| 2141286 | 12/1984 | United Kingdom | 310/321 |

Primary Examiner—Mark O. Budd
Attorney, Agent, or Firm—Ostrolenk, Faber, Gerb & Soffen

[57] ABSTRACT

An electronic component comprises a plate-shaped element, electrodes being formed on both main surfaces of this plate-shaped element. A metal plate having nearly the same shape and nearly the same size as the element is provided for supporting one main surface of the element. The electrode on this surface of the element is connected to the metal plate, to which one lead terminal is connected. Further lead terminals are provided beside the element, having tips which are bent inside so as to face each other, and are connected to corresponding electrodes formed on the other main surface of the element. The metal plate reinforces and shields the plate-shaped element.

15 Claims, 9 Drawing Sheets

ELECTRONIC COMPONENT HAVING A PLATE-SHAPED ELEMENT

This is a continuation of Application Ser. No. 07/273,109 filed on Nov. 16, 1988 (now abandon), which is a continuation of Application Ser. No. 06/787,421 filed on Oct. 15, 1985 (now abandon).

BACKGROUND OF THE INVENTION

1. Field of the Invention

The present invention relates to an electronic component. More specifically, the present invention relates to an electronic component having a plate-shaped element, such as a ceramic resonator, a ceramic filter or an integrated circuit element.

2. Description of the Prior Art

FIG. 1 and FIG. 2 shows a filter element which is part of the background of the present invention. FIG. 1 is a front view thereof, and FIG. 2 is a rear view thereof. A filter element 10 as shown in FIG. 1 and FIG. 2 is an energy-trapping type piezoelectric filter utilizing a thickness-sliding vibration mode (shear mode). Since the present invention is suitable particularly for such a piezoelectric filter, a description will be made of this filter element to the extent required for understanding the present invention.

The element 10 comprises a strip-shaped piezoelectric substrate 12 composed, for example, of a piezoelectric ceramic materials, and on this piezoelectric substrate 12, a slit 13 is formed from the top end thereof to nearly the center thereof in the direction of a longer side. Also, on both the right and the left sides of a front main surface of the piezoelectric substrate 12 divided by the slit 13, two pairs of vibrating electrodes 14a and 14c1, on the left side and 14b and 14c2 on the right side, are formed, respectively. Among the right and the left vibrating electrodes, the electrodes 14c1 and 14c2 are connected in common. On the rear main surface of the piezoelectric substrate 12, common electrodes 16a and 16b are formed opposite to respective pairs of vibrating electrodes 14a and 14c1, and 14b and 14c2.

Also, on the front main surface of the piezoelectric substrate 12, a drawing-out part 18a formed which extends to the top end of the piezoelectric substrate 12 from the vibrating electrode 14a and a drawing-out part 18b is formed which extends to the top end of the piezoelectric substrate 12 from the vibrating electrode 14b. Furthermore, on the other (rear) main surface of the piezoelectric substrate 12, the common electrodes 16a and 16b are connected in common to form a drawing-out part 20 which extends to the bottom end of the piezo-electric substrate 12. These electrodes and drawing-out parts are formed, for example, by metallizing or sputtering silver, nickel or the like.

At least one lead terminal is connected to such a filter element 10. More specifically, as shown in FIG. 3, a lead terminal 22 is connected to the drawing-out part 20, a lead terminal 24a to the drawing-out part 18a and a lead terminal 24b to the drawing-out part 18b respectively, for example, by means of soldering.

Furthermore, as shown in FIG. 4, the filter element 10 to which the lead terminals 22, 24a and 24b are connected is coated with an elastic material 26 such as silicone rubber or the like, and is further coated with a sheathing member 28 such as resin or the like, thus forming a piezoelectric filter 30 having a circuit configuration as shown in FIG. 5.

In this piezoelectric filter 30, the filter element 10 floats in the elastic material 26 even after completion, and needless to say, during manufacturing, and therefore the element 10 has sometimes been broken by an external shock. Particularly, this breakage has taken place in filters in which the slit 13 was formed at the center of the piezoelectric substrate 12 of the element 10.

In order to prevent such a crack or split of the piezoelectric substrate 12, as shown in FIG. 6, use of a reinforcing substrate 40 has been proposed. More specifically, conductor patterns 42, 44a and 44b corresponding to respective tip portions of the lead terminals 22, 24a and 24b in FIG. 3 are formed on the surface of a reinforcing substrate 40 composed of an insulating material. The filter element 10 is placed on this reinforcing substrate 40, and one end of each of the conductor patterns 42, 44a and 44b is connected to a respective one of the drawing-out parts 20, 18a and 18b of the element 10, for example, by means of soldering. Then, the lead terminals 22, 24a and 24b are connected to each of the other ends of the conductor patterns 42, 44a and 44b, for example, by means of soldering.

In this prior art filter, the mechanical strength is great enough that no crack or the like of the element takes place, but it requires preparation of a reinforcing substrate whereon a predetermined conductor pattern is formed as a separate part. Thus not only the number of parts is increased but also the number of places to be soldered is increased, and also the manufacturing process becomes more complicated, resulting in higher cost. Furthermore, since the conductor patterns are required to be formed on the reinforcing substrate, the reinforcing substrate cannot be made smaller than the element, so this prior art filter cannot easily be miniaturized.

SUMMARY OF THE INVENTION

Therefore, a principal object of the present invention is to provide an electronic compound having improved mechanical strength with a simpler configuration.

To be brief, the present invention relates to an electronic component wherein a plate-shaped element is supported wholly by a metal plate having nearly the same shape and nearly the same size as the element, and one lead terminal is formed which extends from this metal plate, the other lead terminals being connected to drawing-out parts on the element.

The plate-element is wholly supported on one main surface of the metal plate and accordingly, the lead terminal extending from the metal plate is connected to the drawing-out part of the element. Thus, an element such as a resistor, capacitor, filter or integrated circuit may be connected between the other lead terminals.

In accordance with the present invention, the element is supported wholly by the metal plate and therefore its shock resisting properties are improved in comparison with the conventional component wherein the element is only coated with an elastic material, and thereby a crack or split of the element can be prevented effectively. Also, since the metal plate has or serves as one lead terminal, or is formed in one piece with the lead terminal, the structure becomes simpler in comparison with the conventional component employing a reinforcing substrate. More specifically, the conventional component as shown in FIG. 6 has a separate reinforcing substrate and separate lead terminals, therefore resulting in an increase in the number of parts and a complicated process in comparison with the conventional component as shown in FIG. 3. On the other hand, in the present invention, the reinforcing metal plate is integrally formed with or serves as the lead terminal, and therefore mechanical strength equal to or greater than that of the component employing the reinforcing substrate is obtained also no separate part is required to be prepared, and further the number of step of solderinhg or the like is not increased. Also, since the metal plate and the lead terminal can be formed simultaneously, for example, by press working, the process is further simplified.

Furthermore, in accordance with the present invention, the metal plate may effectively as a shielding plate. More specifically, for example, in an electronic component having a piezoelectric filter element as shown in FIG. 1 and FIG. 2, the input side and the output side of the filter are directly coupled through a stray capacity, and accordingly the spurious characteristic in the attenuation region is worse. However, when the component is grounded by the metal plate of the present invention, the effect is as if a shielding plate were placed between the input and the output, and therefore in accordance with the present invention, isolation between the input and output is improved. In the case where the present invention is applied to the piezoelectric filter element as shown in FIG. 1 and FIGS. 2, the spurious characteristic in the attenuation region is improved, for example, by 5 dB in comparison with the conventional component.

Furthermore, in accordance with the present invention, holding or supporting the element in the manufacturing process is simplified. More specifically, in the conventional structure as shown in FIG. 3, the element cannot be pinch-held by the lead terminals, and the lead terminals cannot be held temporarily fixed before soldering, and in the conventional structure as shown in FIG. 6, it is difficult to hold the element and the reinforcing substrate at the same time in a one-piece fashion. On the other hand, in accordance with the present invention, the element is supported wholly on the metal plate, and therefore the element can be temporarily fixed (or held) while pinch-held by the metal plate and the lead terminals, and this structure is very convenient particularly in the case where the electronic component is manufactured using an automatic assembling apparatus.

These objects and other objects, features, aspects and advantages of the present invention will become more apparent from the following detailed description of embodiments of the present invention when taken in conjunction with the accompanying drawings.

BRIEF DESCRIPTION OF THE DRAWINGS

FIG. 21 is a front view of the member after the bent portion is formed.

DESCRIPTION OF THE PREFERRED EMBODIMENTS

Figure 1:
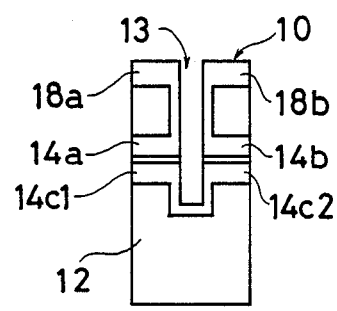
FIG. 1 and FIG. 2 are front and rear views, respectively, of one example of a piezoelectric filter element which part of the background of the present invention and can be used for the present invention.
Figure 2:
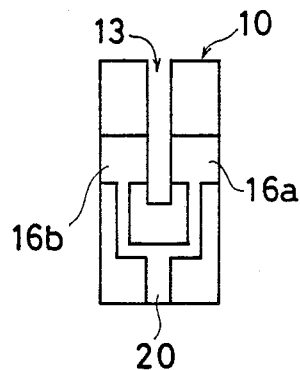
Figure 7:
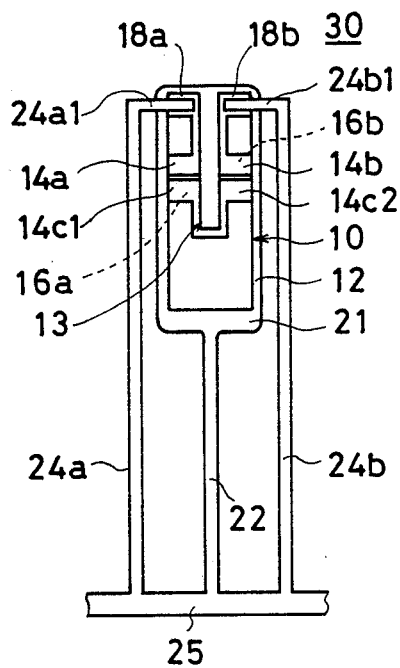
FIG. 7 is a front view showing one embodiment in accordance with the present invention.
Figure 8:
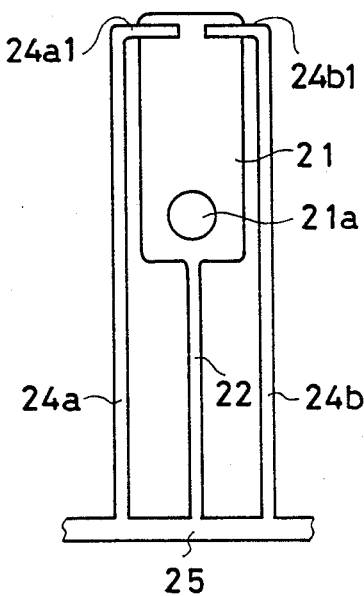
FIG. 8 is a front view showing a hoop member used for the embodiment in FIG. 7.
Figure 9:
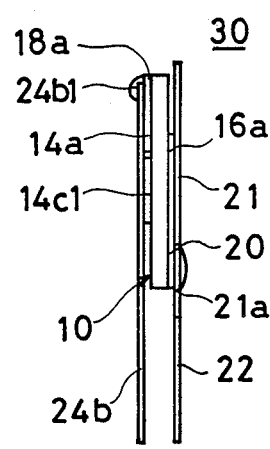
FIG. 9 is a side view of the embodiment in FIG. 7.

FIG. 7 is a front view showing one embodiment in accordance with the present invention. FIG. 8 is a front view showing the metal plate and lead terminals used for the embodiment in FIG. 7. FIG. 9 is a side view of the embodiment in FIG. 7. In this embodiment, the piezoelectric filter element 10 as shown in FIG. 1 and FIG. 2 is used, but it is pointed out in advance that the present invention is applicable to any other arbitrary electronic component such as an element using piezoelectric ceramics, for example, a ceramic resonator, a single crystal piezoelectric element employing quartz or the like, or an integrated circuit other than the piezoelectric element or the like.

In reference to FIG. 8, a metal plate 21 is composed, for example, of a metal such as German silver, brass, 42-nickel (nickel-iron alloy containing nickel of 42%) or the like, being formed in nearly the same shape and nearly the same size as those of the element 10. As shown in FIG. 8, on this metal plate 21 a through hole 21a is formed at the position corresponding to the drawing-out part 20 of the element 10. This through hole 21a has advantages in that positional deviation between the metal plate and the element 10 can be made sure visually therethrough, and connecting and fixing the element 10 to the metal plate 21 such as by soldering or the like can be performed easily, but the hole may not be formed, as the case may be.

A lead terminal 22 is formed which extends downward from the center of the bottom end of the metal plate 21. The lead terminal 22 is formed by extending upward from a frame 25. Also, lead terminals 24a and 24b are formed so as to extend upward from the frame 25 in parallel with each other and being kept a constant predetermined distance from along the sides of the lead terminal 22. Accordingly, the metal plate 21 and the lead terminals 22, 24a and 24b are formed in a one-piece fashion while extending from the frame 25. This one-piece combination of components will be preferred to below at times as a so-called hoop member. Furthermore, at the free ends of the lead terminals 24a and 24b, there are formed connecting portions 24a1 and 24b1, the tip ends of which are faced to each other. These connecting portions 24a1 and 24b1 are formed by being bent toward the metal plate 21 and superposed on the metal plate 21. The connecting portions 24a1 and 24b1 correspond respectively to the drawing-out parts 18a and 18b when the element 10 as shown in FIG. 1 and FIG. 2 is placed on the metal plate 21.

In reference to FIG. 7 and FIG. 9, the element 10 (refer to FIG. 1 and FIG. 2) is placed on the surface of the metal plate 21. In this case, the element 10 is pinch-held by the metal plate 21 and the connecting portions 24a1 and 24b1 to be placed in a temporarily fixed state. More specifically, the element 10 is supported wholly by the metal plate 21, and the connecting portions 24a1 and 24b1 are placed on the main surface of the top end part of the element 10. The respective lead terminals 24a1 and 24b1 extend in a one-piece fashion from the frame 25, therefore having a spring property. The spring property of these lead terminals 24a and 24b enables the element 10 to be pinch-held between the metal plate 21 and the lead terminals 24a and 24b.

Next, the lead terminals 22, 24a and 24b are connected to the element 10. First, the drawing-out part 20 of the element 10 is connected electrically and fixed mechanically to the peripheral portion of the metal plate 21 defining the through hole 21a, for example, by means of soldering as particularly shown in FIG. 9. Such connection and fixing of the metal plate 21, that is, the lead terminal 22, to the drawing-out part 20 of the element 10 may be performed otherwise, for example, by means of a conductive adhesive agent. Then, the drawing-out parts 18a and 18b of the element 10 are connected electrically and fixed mechanically to the connecting portions 24a1 and 24b1 of the lead terminals 24a and 24b respectively, for example, by means of soldering or a conductive adhesive agent.

Thereafter, the circumference of the element 10 is covered by an elastic material such as silicone rubber or the like (not illustrated) after the lead terminals 22, 24a and 24b have been connected, and further a sheathing member (not illustrated) such as resin or the like is formed around it.

Figure 4:
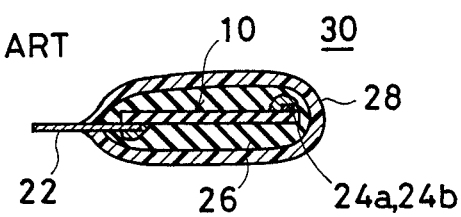
FIG. 4 is a cross-sectional view showing one example of a conventional piezoelectric filter.

Finally, the lead terminals 22, 24a and 24b are cut off the frame 25, and a piezoelectric filter 30 as shown in FIG. 4 is completed.

Figure 10:
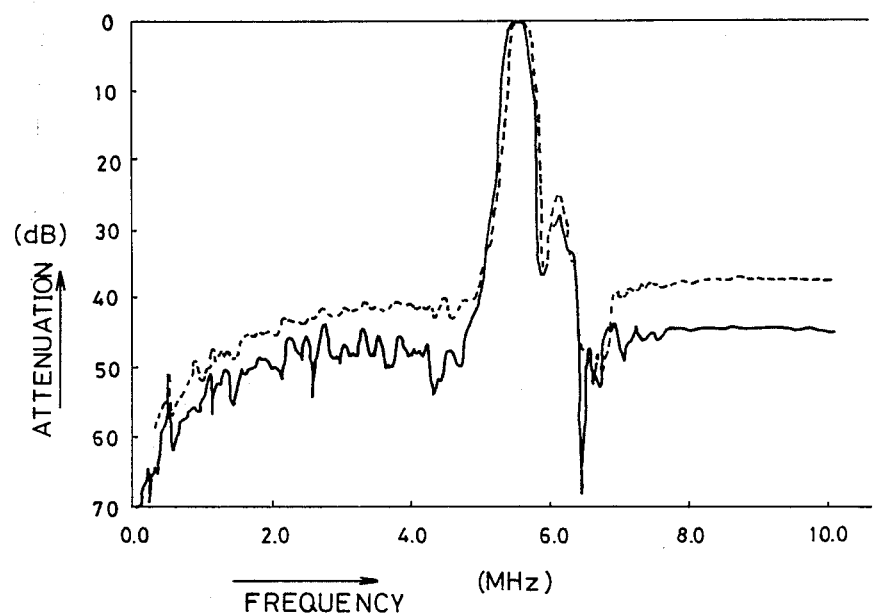
FIG. 10 is a graph showing frequency characteristics, wherein a solid line shows a characteristic of the embodiment in FIG. 7 and a dotted line shows a characteristic of the conventional example.

FIG. 10 is a graph showing frequency characteristics of a piezoelectric filter, a solid line showing the characteristics of this embodiment, and the dotted line showing the characteristics of the conventional example.

Figure 3:
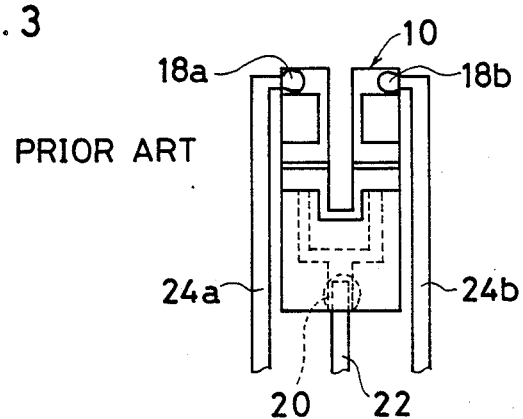
FIG. 3 is front view showing lead terminals mounted on the element as shown in FIG. 1 and FIG. 2.
Figure 5:
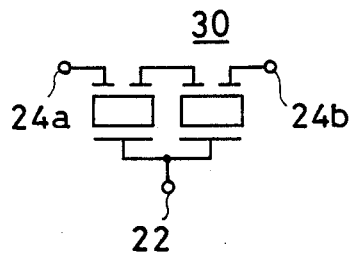
FIG. 5 is a circuit diagram of a piezoelectric filter as shown in FIG. 4.
Figure 6:
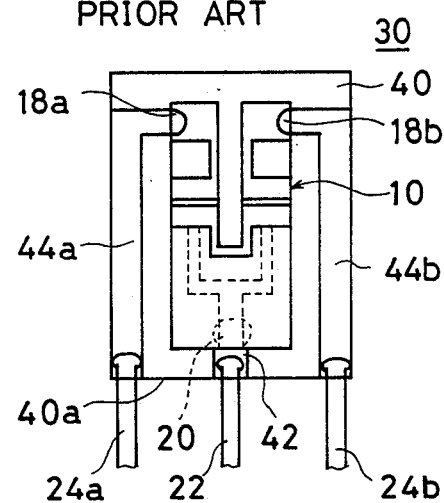
FIG. 6 is a front view showing another example of the conventional piezoelectric filter.

As is obvious from FIG. 10, the piezoelectric filter 30 of this embodiment is improved in the spurious characteristic in the attenuation region by about 5 dB in comparison with the conventional piezoelectric filter as shown in FIG. 3 or FIG. 6. This is because the metal plate 21 acts as a shielding plate. More specifically, in the piezoelectric filter 30 of this embodiment, the metal plate 21 is placed between the input and the output of the circuit as shown in FIG. 5, and therefore this metal plate 21 acts as a shielding plate between the input and the output by grounding it, and thereby isolation between the input and the output is improved and the spurious characteristic of the filter is improved.

Meanwhile, in the case where 42-nickel is used as the material for the metal plate 21 and the lead terminals 22, 24a and 24b, the temperature characteristic of the piezoelectric filter 30 can be improved in comparison with the case where another common material, for example, German silver or brass is used. This is because 42-nickel has nearly the same linear expansion coefficient and Young's modulus as those of the piezoelectric substrate 12 as shown in the following table. When the linear expansion coefficient or the like of the substrate 12, i.e. the element 10 differs greatly from that of the metal plate 21, not only does the center frequency deviate widely due to a change in temperature, but also a breakage takes place at the joint of the piezoelectric substrate 12 and the metal plate 21 and the lead terminals 22, 24a and 24b, or a crack is produced in the piezoelectric substrate 12 as a result of increased stress due to thermal shock. However, in the case of 42 nickel, such change in the electric characteristic and deterioration in the mechanical strength can be prevented effectively.

The results of the experiments conducted by the inventors show that, for example, in the case of German silver the temperature characteristic of the center frequency of the filter is N30 ppm/°C., while in the case of 42-nickel the temperature characteristic of the center frequency is as small as N10 ppm/°C.

TABLE

| Material | Linear expansion coefficient | Young's modulus |
| --- | --- | --- |
| German silver | $19 \times 10^{-6}$ | $13 \times 10^{10}$ |
| Brass | $21 \times 10^{-6}$ | $10 \times 10^{10}$ |
| 42- Nickel | $4 \times 10^{-6}$ | $15 \times 10^{10}$ |
| Piezoelectric ceramics | $3 \times 10^{-6}$ | $16 \times 10^{10}$ |

Figure 11:
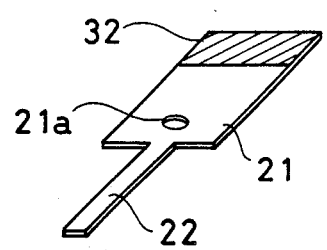
FIG. 11 is a perspective view showing a modified example of a metal plate as in FIG. 8.

FIG. 11 is a perspective view showing a modified example of the metal plate as shown in FIG. 8. In this example, a solder resisting film 32 is formed at the tip part of the surface of the metal plate 21. The solder resisting film 32 is formed by coating a solder resisting resin such as solder resist ink or the like. Without the solder resisting film 32, a short-circuit due to a solder bridge sometimes takes place across the drawing-out parts 18a and 18b and the tip part of the metal plate 21 when the lead terminals 24a and 24b are soldered to the drawing-out parts 18a and 18b. When the solder resisting film 32 is formed such a shortcircuit due to a solder bridge can be prevented, and thereby the yield rate of products can be improved. Accordingly, when the solder resisting film 32 is formed, the lead terminals 24a and 24b and the drawing-out parts 18a and 18b can be soldered also by means of dipping, and thereby an improvement in mass-productivity can be expected.

Figure 12:
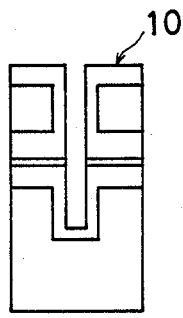
FIG. 12 and FIG. 13 show front and rear views, respectively of a modification example of the element as shown in FIG. 7, according to another embodiment of the invention.
Figure 13:
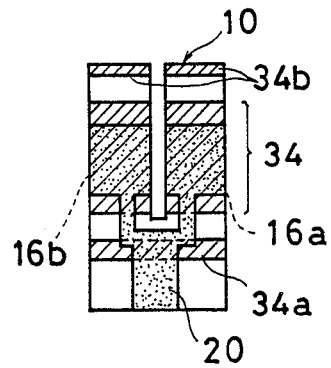

FIG. 12 and FIG. 13 show a modified example of the element as shown in FIG. 1, FIG. 12 being a front view thereof, and FIG. 13 being a rear view thereof. In this example, as is understood particularly from FIG. 13, a solder resisting film 34 is formed on and around the common electrodes 16a and 16b b of the element 10. The solder resisting film 34 may be of solder resist ink or the like. When such a solder resisting film 34 is not formed, solder adheres onto the common electrodes 16a and 16b of that portion, and vibration is damped. However, the solder resisting film 34 prevents that portion of the common electrodes 16a and 16b from solder adhesion, and therefore the damping of vibration as described above can be prevented effectively. Accordingly, the solder resisting film 34 is formed preferably with a width nearly equal to the width of the common electrodes 16a and 16b, and with a length longer than the length in the up-down direction of the common electrodes 16a and 16b. By changing the thickness or the size of this solder resisting film 34, the vibration frequency of the element 10 can be adjusted.

Also, as shown in FIG. 13, other solder resisting films 34a is and 34b may be formed. The solder resisting film 34a formed between the common electrodes 16a and 16b and the drawing-out part 20, preventing solder from flowing from the drawing-out part 20 to adhere to the common electrodes 16a and 16b. The solder resisting film 34b is formed on the top end part of the rear surface of the element 10, and thereby can prevent solder from flowing from the drawing-out part 18a and 18b of the element 10 to adhere to the common electrodes 16a and 16b.

Meanwhile, forming these solder resisting films 34a and 34b has the additional advantage of supporting each element 10 when a plurality of elements 10 are cut while piled up, so that the element 10 does not incline.

Figure 14:
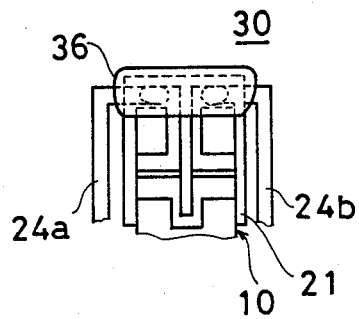
FIG. 14 and FIG. 15 show front and side views, respectively, of another embodiment in accordance with the present invention.
Figure 15:
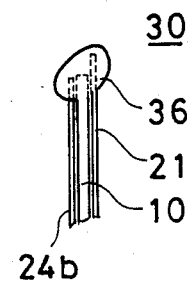

FIG. 14 and FIG. 15 show another embodiment in accordance with the present invention, FIG. 14 being a front view thereof, and FIG. 15 being a side view thereof. This embodiment comprises a reinforcing member 36 which is formed so as to cover the top end part of the piezoelectric substrate 12 of the element 10 and the connecting portions 24a1 and 24b1 of the lead terminals 24a and 24b. The reinforcing member 36 prevents either one of the lead terminals 24a and 24b from moving singly when an external force is applied. More specifically, if no reinforcing member 36 is provided, only one of lead terminals 24a or 24b may be deformed and the connection part between the elememt 10 and the deformed terminal may be peeled off or broken, but by deforming both terminals 24a and 24b similarly by the reinforcing member 36, a breakage or the like of the element 10 can be prevented effectively. Consequently, reliability of the electronic component can be improved.

Figure 16:
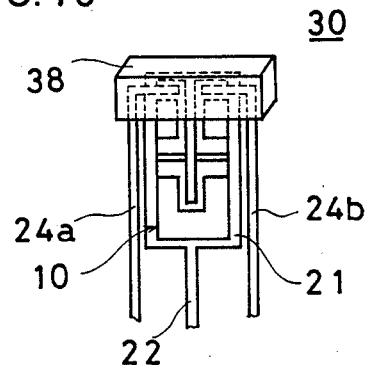
FIG. 16 is a perspective view showing a modified example of the embodiment as shown in FIG. 14 and FIG. 15.

FIG. 16 is a perspective view showing a modified example of the embodiment as shown in FIG. 14 and 15.

In this example, a reinforcing cap 38 is used in place of the reinforcing member 36 as shown in FIG. 14 and FIG. 15. The reinforcing cap 38 is formed, for example, of a synthetic resin in a shape capable of covering the tip part of the piezoelectric filter 30, being fixed to the tip of the piezoelectric filter 30, for example, by an adhesive. Thus, a breakage or the as in of the element 10 can be prevented like the previous embodiment by the reinforcing cap 38, and thereby an improvement in reliability of the electronic component can be expected.

Figure 17:
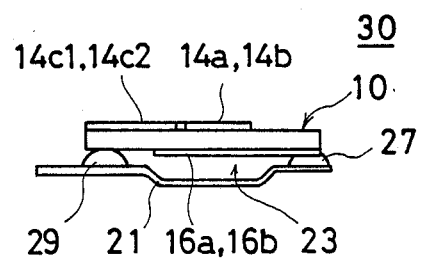
FIG. 17 is a side view showing still another embodiment in accordance with the present invention.

FIG. 17 is a side view showing another embodiment in accordance with the present invention. In this embodiment, a large gap 23 is formed between the element 10 and the metal plate 21. The gap 23 can be formed by bending or reforming the metal plate 21 at that portion. The gap 23 serves to prevent the problem of a capillary phenomenon taking place between the element 10 and the metal plate 21 and thereby solder flowing adhere to the common electrodes 16a and 16b. Consequently, damping of vibration of the element 10 which takes place when solder adheres to the common electrodes 16a and 16b can be prevented effectively. Furthermore, a large-size formation of this gap 23 improves the efficiency of cleaning flux, and resultingly a vibration due to the remaining flux which is produced at the metal plate 21 and the element 10 and a risk of corrosion of the drawing-out electrode can be alleviated.

Figure 18:
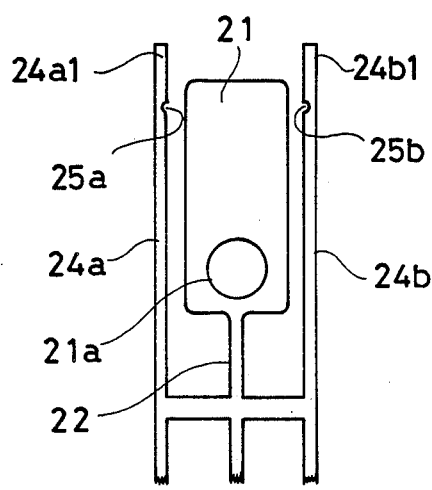
FIG. 18 through FIG. 21 show another example of a hoop member, FIG. 18 and FIG. 20 being front view of the member before forming a bent portion, FIG. 19 being a side view thereof.
Figure 19:

FIG. 18 and FIG. 19 show another example of the hoop member, FIG. 18 being a front view thereof, and FIG. 19 being a side view thereof. As shown particularly in FIG. 19, the metal plate 21 of this embodiment is curved at the center portion thereof, that is, the portion facing the common electrode (not illustrated). This curve of the metal plate 21 is formed relatively large as shown particularly by an arrow B in FIG. 19. By forming the curve at the metal plate 21 as described above, a large gap similar to the gap 23 in FIG. 17 is formed between the metal plate 21 and the common electrodes 16a and 16b of the element 10 when the element 10 is mounted on the metal plate 21, and thereby a similar effect to that of the embodiment in FIG. 17 can be expected.

Figure 20:
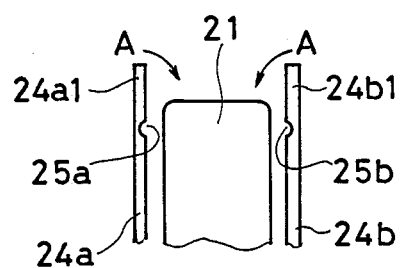
Figure 21:
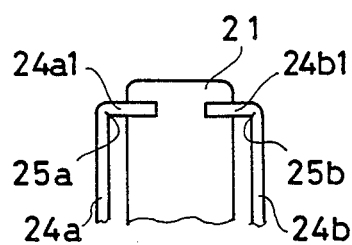

FIG. 20 and FIG. 21 shows a process of forming the connecting portion of the lead terminal as shown in FIG. 18 and FIG. 19, FIG. 20 being a front view of the lead terminal before forming the connecting portion, and FIG. 21 being a front view of the lead terminal after forming the connecting portion. As shown in FIG. 18 and FIG. 20, notches 25a and 25b are formed inside the lead terminals 24a and 24b in the vicinity of the tips thereof, respectively. Then, a force is applied to these tips in the direction shown by an arrow A with these notches 25a and 25b acting as fulcrums. Thereby, as shown in FIG. 21, the connecting portions 24a1 and 24b1 are formed.

Thus, the notches 25a and 25b are formed at predetermined positions of the lead terminals 24a and 24b and then the connecting portions 24a1 and 24b1 are formed by utilizing these notches variations in the shape and size of the connecting portions 24a1 and 24b1 can be reduced and in this way, and as a result the yield rate of products can be improved.

Figure 22:
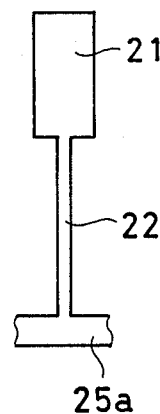
FIG. 22 and FIG. 23 show still another example of a hoop member, FIG. 22 being a front view showing a hoop member wherein a metal plate and lead terminal extending therefrom are formed in a one-piece fashion, and FIG. 23 being a front view showing another hoop member wherein the other lead terminals are formed in a one-piece fashion.
Figure 23:
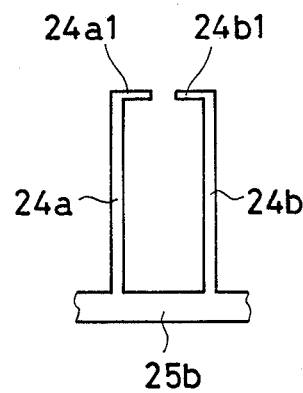

FIG. 22 and FIG. 23 show still another embodiment of the hoop member, FIG. 22 being a front view showing one hoop member comprising a metal plate and lead terminals extending therefrom, and FIG. 23 being a front view showing another hoop member other than the metal plate.

In this embodiment, the metal plate 21 and the lead terminal 22, and the lead terminals 24a and 24b, are constituted as separate hoop members. More specifically, as shown in FIG. 22, one hoop member comprises a frame 25a, which forms the metal plate 21 and the lead terminal 22 extending from the center of the bottom part thereof in one-piece fashion. The other hoop member comprises a frame 25b which forms the lead terminals 24a and 24b in one-piece fashion. Then, the connecting portions 24a1 and 24b1 are formed at the tips of the lead terminals 24a and 24b.

Thus, when the metal plate 21 and the lead terminal 22, and the lead terminals 24a and 24b are constituted with separate hoop members, the lead terminals 24a and 24b and the connecting portions 24a1 and 24b1 can be formed by punching, and therefore the bending process as described above can be dispensed with.

Figure 24:
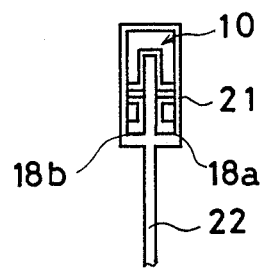
FIG. 24 and FIG. 25 show an element mounted on a hoop member as shown in FIG. 22, FIG. 24 being a front view thereof, and FIG. 25 being a side view thereof.
Figure 25:
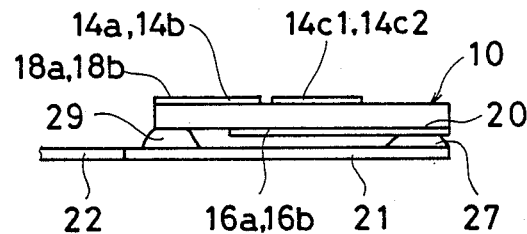

FIG. 24 and FIG. 25 show a mounting arrangement of the element 10 on the hoop member as shown in FIG. 22, FIG. 24 being a front view thereof, and FIG. 25 being a side view thereof. As shown in FIG.24, the element 10 is placed on the metal plate 21 with the drawing-out parts 18a and 18b facing the lead terminal 22 side. Then, as shown in FIG. 25, the drawing-out part 20 of the element 10 is connected to the tip of the metal plate 21, for example, by a conductive adhesive agent 27. Furthermore, the rear surface parts of the element 10 corresponding to the drawing-out parts 18a and 18b are fixed to the terminal 22 side of the metal plate 21, for example, by a insulating adhesive agent 29. Thus, the element 10 is fixed to the metal plate 21 with the common electrodes 16a and 16b separated from the metal plate 21. Accordingly, sufficiently large gaps can be formed between the metal plate 21 and the common electrodes 16a and 16b, and thereby solder or the like cannot adhere undesirably to the common electrode.

Figure 26:
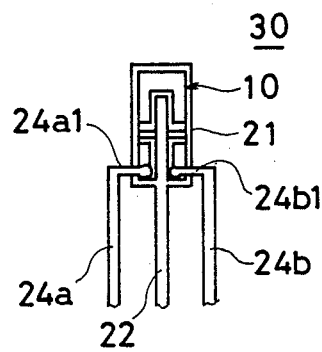
FIG. 26 and FIG. 27 further show the use of the hoop member as shown in FIG. 22 and FIG. 23, FIG. 26 being a front view thereof, and FIG. 27 being a side view thereof.
Figure 27:
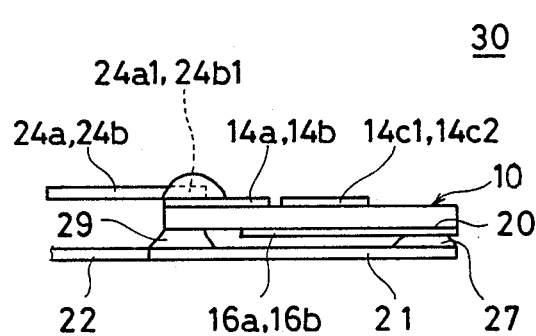

Next, as shown in FIG. 26 and FIG. 27, the lead terminals 24a and 24b are connected to the element 10. More specifically, the drawing-out part 18a is connected to the lead terminal 24b and the drawing-out part 18b to the lead terminal 24a respectively, for example, by means of soldering.

In this example, the lead terminals 24a and 24b have nearly the same length as that of the lead terminal 22. Accordingly, the drawing-out parts 18a and 18b of the element 10 mounted on this metal plate 21 are faced downward. However, the lead terminals 24a and 24b may be lengthened to extend to the opposite end of the element 10 as shown in FIG. 7.

Figure 28:
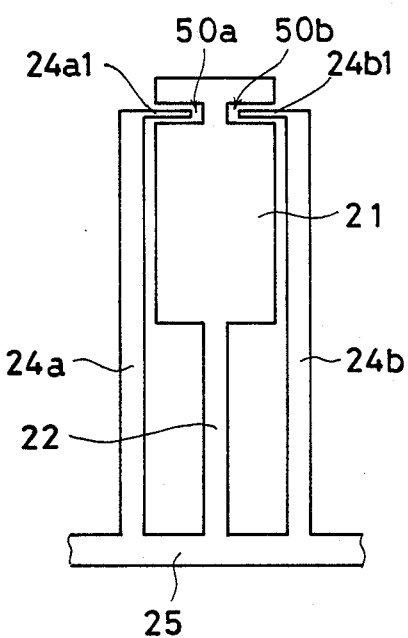
FIG. 28 is a front view showing another example of a hoop member.

FIG. 28 is a front view showing another example of the hoop member. In this example, the lead terminals 22, 24a and 24b are formed in a one-piece fashion by one frame 25 like the previous embodiment in FIG. 8. Then, notches 50a and 50b are formed respectively from the both sides in the direction of width toward the center of the metal plate 21 in the vicinity of the top end part of the metal plate 21. Then, these notches 50a and 50b acts as relief for the connecting portions 24a1 and 24b1.

Thus, by forming the notches 50a and 50b on the metal plate 21, the metal plate 21 and the lead terminals 22, 24a and 24b can be formed by one punch. Also, the bending process for forming the connecting portions 24a1 and 24b1 can be dispensed with.

Figure 29:
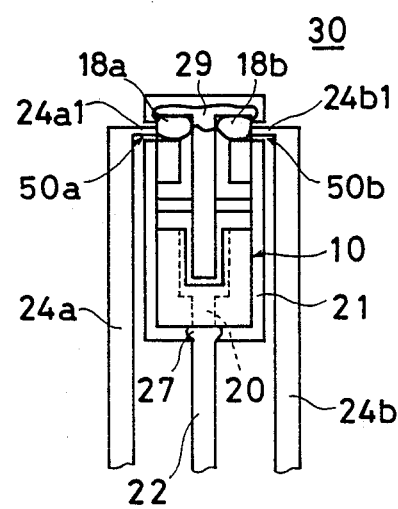
FIG. 29 and FIG. 30 show use of the hoop member as shown in FIG. 28, FIG. 29 being a front view thereof, and FIG. 30 being a side view thereof.
Figure 30:
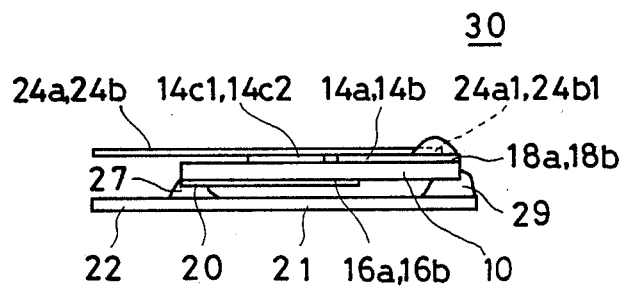

FIG. 29 and FIG. 30 show an element mounted on the hoop member as shown in FIG. 28, FIG. 29 being a front view thereof, and FIG. 30 being a side view thereof. Also in this case, like the embodiment as shown in FIG. 26 and FIG. 27, the drawing-out part 20 is connected to the metal plate 21 by the conductive adhesive 27, and the rear parts of the drawing-out parts 18a and 18b of the element 10 are fixed to the tip of the metal plate 21 by the insulating adhesive 29, and the element 10 is fixed so that the common electrodes 16a and 16b have a sufficiently large distance from the metal plate 21.

Figure 31:
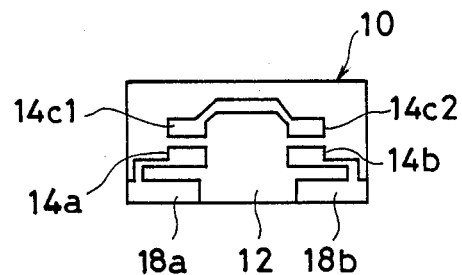
FIG. 31 and FIG. 32 show front and rear views, respectively, of another example of an element.
Figure 32:
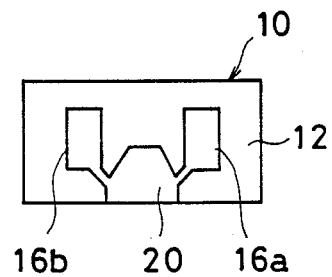

FIG. 31 and FIG. 32 show another example of the element, FIG. 31 being a front view thereof, and FIG. 32 being a rear view thereof. The element 10 is an energy-trapping type piezo-electric filter element utilizing the thicknness longitudinal vibration mode.

Figure 33:
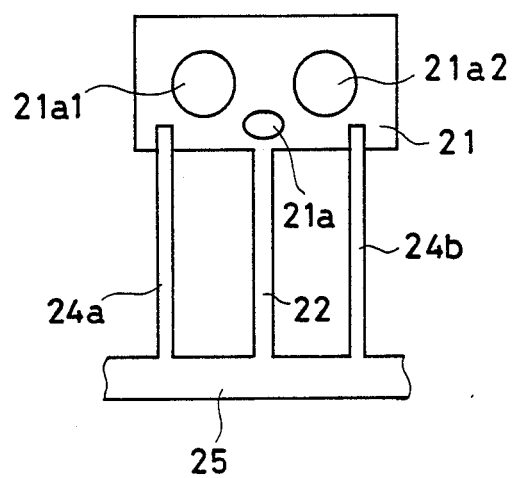
FIG. 33 is a front view showing a hoop member used for the element as illustrated in FIG. 32.

FIG. 33 is a front view showing a metal plate and lead terminals for use when the element as shown in FIG. 31 is employed. The metal plate 21 is formed in nearly the same shape and nearly the same size as the element 10 as shown in FIG. 31 and FIG. 32, and the through-hole 21a is formed at the center of the bottom part thereof. The through-hole 21a is formed at the position corresponding to the drawing-out part 20 of the element 10 when the element 10 is supposed on the metal plate 21. Furthermore, through-holes 21a1 and 21a2 are formed at two places right and left of the center of the metal plate 21. The through-holes 21a1 and 21a2 are formed respectively at the positions corresponding to the common electrodes 16a and 16b, being utilized for forming air gaps at two portions of the vibrating electrodes 14a and 14c1, and 14b and 14c2.

Figure 34:
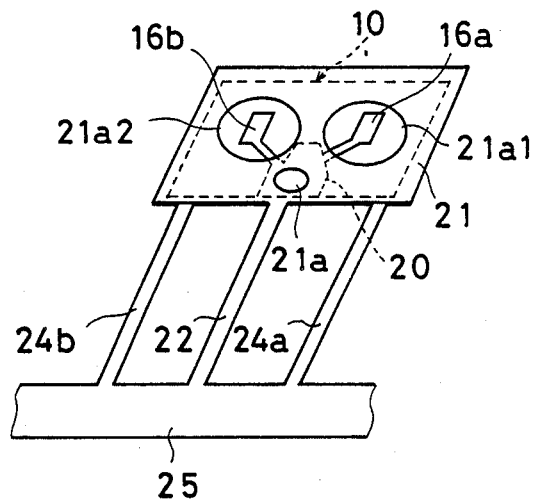
FIG. 34 is a perspective view showing the element as shown in FIG. 31 and FIG. 32, mounted on the hoop member as shown in FIG. 33.

The element 10 a shown in FIG. 31 and FIG. 32 is mounted on the metal plate 21 as shown in FIG. 33 as shown by a dotted line in FIG. 34. For example, the drawing-out part 20 of the element 10 is soldered to the metal plate 21 around the through-hole 21a, and further the lead terminals 24a and 24b are soldered to the drawing-out parts 18a and 18b, respectively.

Figure 35:
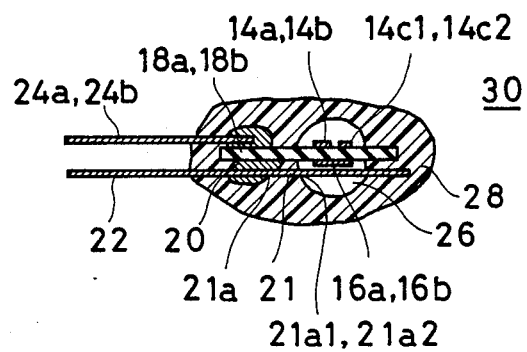
FIG. 35 is a cross-sectional view showing another embodiment of the invention.

Thereafter, as shown in FIG. 35, and as disclosed in detail in Japanese Patent Publication No. 22384/1970, for example, a wax layer is formed in a certain size around the vibrating electrodes 14a, 14b, 14c1 and 14c2 and the common electrodes 16a and 16b, and thereon the sheathing member 28 comprising, for example, epoxy resin is stuck. When this sheathing member 28 is cured by heat, wax sinks into the sheathing member 28 to form the air gap 26 as shown in FIG. 35.

Although embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric component, comprising:
a plate-shaped element which includes a piezoelectric substrate having a right side portion and a left side portion divided by a slit formed from a top end to a middle portion of said substrate in a longitudinal direction of said substrate, respective pairs of vibrating electrodes formed on front surfaces of said right side portion and said left side portion, respective common electrodes formed on rear surfaces of said right side portion and said left side portion so as to oppose said pairs of vibration electrodes, respectively, first connecting electrodes each respectively extended from one electrode of each of said respective pairs vibration electrodes to said top ends of said right side portion and said left side portion, and a second connecting electrode formed on a rear surface of said substrate and extended from said respective common electrodes to a bottom end of said substrate;

a metal plate which is formed with substantially the same shape and substantially the same surface area as said substrate so as to receive said plate-shaped element on a first main surface thereof, on said first main surface of which said rear surface of said substrate is placed, said metal plate having a through-hole which is formed at a position associated with said second connecting electrode;

a conductive connecting member for interconnecting said second connecting electrode and said first main surface of said metal plate through said through-hole on said metal plate;

a first lead terminal integral with and extending from said metal plate; and second terminals conductively connected to each of said first connecting electrodes, respectively, each of said second lead terminals having a bent tip portion which is conductively connected to each of said first connecting electrodes such that said second lead terminals can extend in the same extending direction as said first lead terminal and in parallel with both side edges of said substrate, respectively.

2. An electronic component in accordance with claim 1, wherein said first lead terminal and said second lead terminals are formed integrally with a removable frame, and said second lead terminals each comprise a connecting means having an end formed at said bent tip portion of said second lead terminals adjacent to said plate-shaped element, and said connecting means is connected to said first connecting electrodes on said front surface of said plate-shaped element.

3. An electronic component in accordance with claim 2, wherein a notch is formed in a side of said metal plate, and said end of said connecting means of said second lead terminals is arranged at a position on the opposite side of said plate-shaped element from said notch.

4. An electronic component in accordance with claim 1, wherein said plate-shaped element includes a piezoelectric filter element having a first and a second main surface.

5. An electronic component in accordance with claim 4, wherein said piezoelectric filter element includes vibrating electrodes which are formed opposite to each other on said first and second main surfaces of said piezoelectric filter element, and said piezoelectric filter element further comprises means for providing spaces between said vibrating electrodes of said first main surface of the piezoelectric filter element and said metal plate.

6. An electronic component in accordance with claim 5, wherein said means for providing spaces includes a curved portion formed on said metal plate.

7. An electronic component in accordance with claim 5, wherein said means for providing spaces includes a protrusion formed on said metal plate.

8. An electronic component in accordance with claim 4, wherein an electrode having an input side and an electrode having an output side are formed on said second main surface of said piezoelectric filter element, and said second lead terminals are each disposed at both sides of said first lead terminal extending from said metal plate, said first and second lead terminals being formed integrally with a removable frame, and said second lead terminals being connected to said electrode having an input side and to said electrode having an output side, respectively.

9. An electronic component in accordance with claim 8, wherein a grounding electrode is formed on said first main surface of said piezoelectric filter element, and said grounding electrode is connected to said metal plate.

10. An electronic component in accordance with claim 8, wherein said electrode having an input side and said electrode having an output side are formed at both side ends opposite to each other on said second main surface of said piezoelectric filter element, and said second lead terminals are connected to said electrode having an input side and said electrode having an output side corresponding thereto respectively by a conductive material, further comprising means disposed at a position on said metal plate associated with said electrode having an input side and said electrode having an output side and preventing said conductive material from adhering to said metal plate.

11. An electronic component in accordance with claim 10, wherein said means for preventing adhesion of said conductive material includes a film member formed on the main surface of said metal plate.

12. An electronic component in accordance with claim 2, which further comprises means for reinforcing said connecting means, said plate-shaped element, and said metal plate, said reinforcing means comprising a reinforcing member and preventing relative movement of said connecting means, said plate-shaped element, and said metal plate.

13. An electronic component in accordance with claim 12, wherein said reinforcing means includes an adhesive agent that is applied to said connecting means, said plate-shaped element, and said metal plate.

14. An electronic component in accordance with claim 12, wherein said reinforcing member of said reinforcing means includes a cap member placed over said connecting means, said plate-shaped element, and said metal plate.

15. An electronic component in accordance with claim 1, wherein a portion said metal plate adjacent to said through-hole is soldered directly to said second connecting electrode of said plate-shaped element.

* * * * *